(12) United States Patent
Ramankutty

(10) Patent No.: US 6,502,163 B1
(45) Date of Patent: Dec. 31, 2002

(54) METHOD AND APPARATUS FOR ORDERING ENTRIES IN A TERNARY CONTENT ADDRESSABLE MEMORY

(75) Inventor: Jayan Ramankutty, Fremont, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/465,638

(22) Filed: Dec. 17, 1999

(51) Int. Cl.[7] .............................................. G06F 12/00
(52) U.S. Cl. ......................................... 711/108; 365/49
(58) Field of Search ................................ 711/108, 202, 711/212, 128; 365/49; 370/389, 392; 709/245, 230, 238

(56) References Cited

U.S. PATENT DOCUMENTS

| | | | |
|---|---|---|---|
| 4,723,224 A | 2/1988 | Van Hulett et al. | ............ 365/49 |
| 5,422,838 A | 6/1995 | Lin | ............... 365/49 |
| 5,568,415 A | 10/1996 | McLellan et al. | ............. 365/49 |
| 5,893,137 A | 4/1999 | Parks et al. | .................. 711/108 |
| 5,946,704 A | 8/1999 | Yoneda et al. | ............... 711/108 |
| 6,052,683 A | * 4/2000 | Irwin | ............................ 707/8 |

OTHER PUBLICATIONS

Hayashi et al., High Speed Table Lookup Engine for IPv6 Longest Prefix Match, May 99, pp. 1576–1581.*

Schultz et al., "Fully Parallel Integrated CAM/RAM Using Preclassification to Enable Large Capacities," *IEEE Journal of Solid–State Circuits*, vol. 31, No. 5, May 1996, pp. 689–699.

* cited by examiner

*Primary Examiner*—Matthew Kim
*Assistant Examiner*—Denise Tran
(74) *Attorney, Agent, or Firm*—Bradley T. Sako

(57) ABSTRACT

A ternary CAM (100) includes a CAM cell array (102) arranged into groups (108-1 to 108-5) for storing data values having a predetermined prefix length. The groups (108-1 to 108-5) are arranged in an order that allows for longest prefix match searches. A prefix length translator (104) can receive prefix length values and translate them into corresponding CAM cell array addresses (CAM_ADD). Thus, a prefix value and corresponding data value can be applied to the CAM (100) and the data value can be written into the group (108-1 to 108-5) corresponding to its prefix length. In this way, a table update operation can be performed without having to reorder entries in the ternary CAM (100).

20 Claims, 7 Drawing Sheets

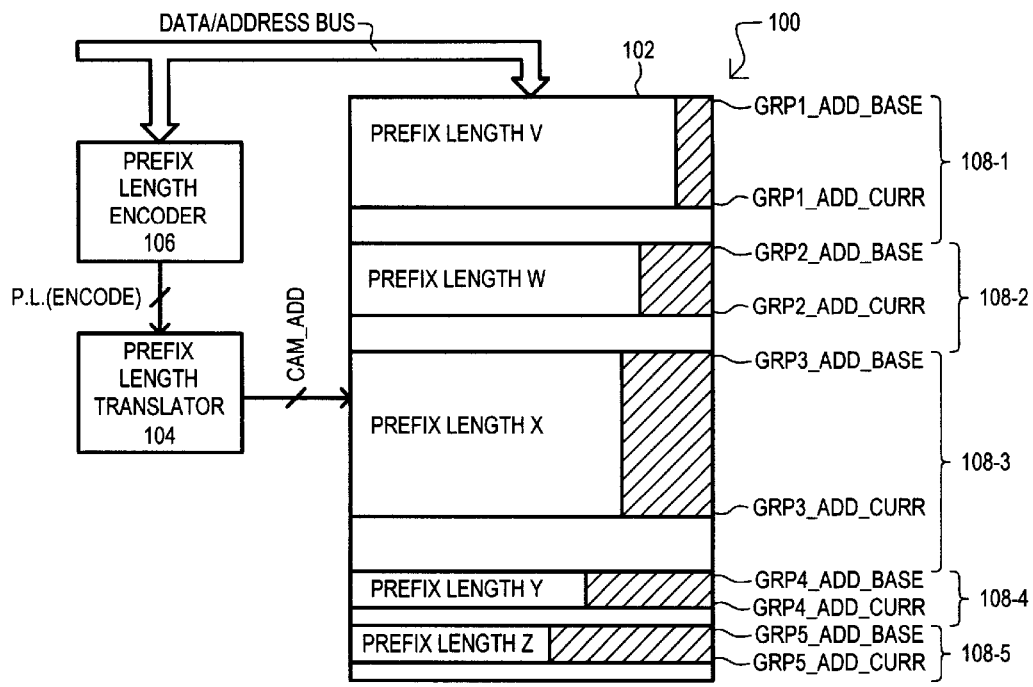
FIG. 1
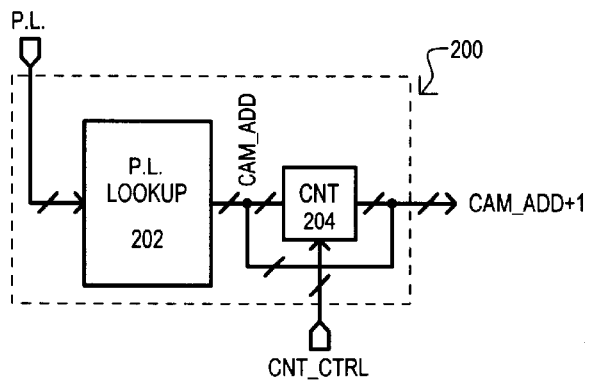
FIG. 2
| ADD<br>(PREFIX LENGTH) | DATA<br>(CAM_ADD) |
|---|---|
| V | GRP1_ADD_CURR |
| W | GRP2_ADD_CURR |
| X | GRP3_ADD_CURR |
| Y | GRP4_ADD_CURR |
| Z | GRP5_ADD_CURR |
FIG. 3

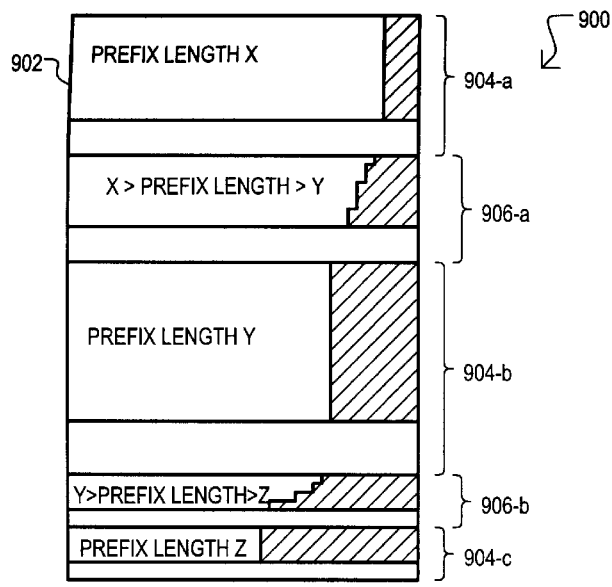
FIG. 9
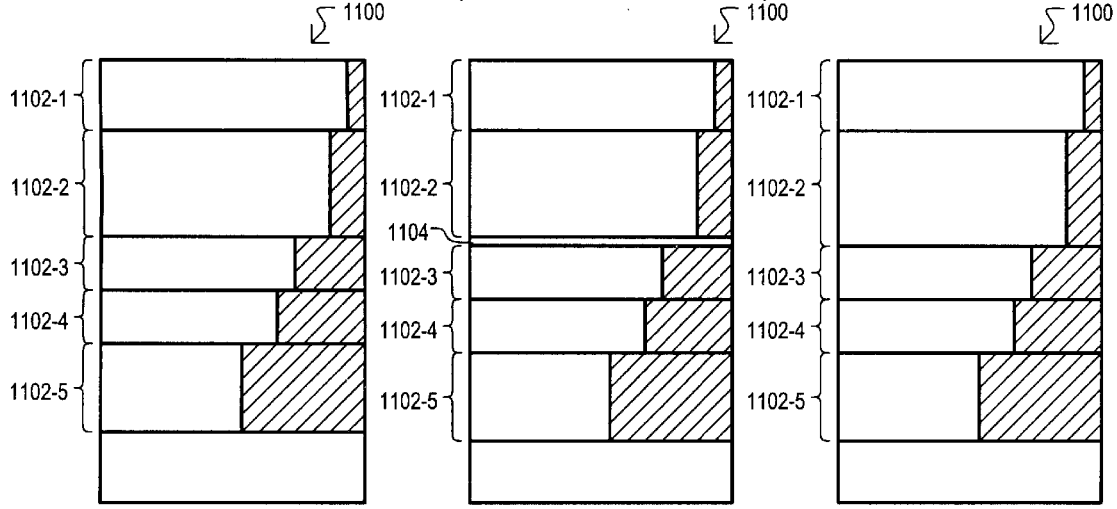
FIG. 10 (BACKGROUND ART)
FIG. 11A (BACKGROUND ART)
FIG. 11B (BACKGROUND ART)
FIG. 11C (BACKGROUND ART)

METHOD AND APPARATUS FOR ORDERING ENTRIES IN A TERNARY CONTENT ADDRESSABLE MEMORY

TECHNICAL FIELD

The present invention relates generally to content addressable memories (CAMs) and more particularly to approaches for ordering entries in a ternary CAM.

BACKGROUND OF THE INVENTION

Information network systems continue to proliferate. In a typical network system, data can transferred in data structures referred to as "packets." A packet can travel through network according to information included in a portion of the packet referred to as a "header." Network switches and/or routers can receive packets, extract information from the packet header, and process the packet according to the extracted information. Network header information can establish, to name just a few possible examples, the destination of a packet and/or the manner in which a packet should be transmitted.

Packet routing and/or switching typically utilizes a matching function. In a matching function, a header field will be compared to a number of entries. In the event the field (or a portion of the field) matches an entry, a match indication will be generated. The match indication can be used to generate particular processing information for the packet.

Routing and switching functions can be performed by general-purpose processors that run a routing algorithm. Such an approach can result in limited throughput of data packets, be expensive in terms of component cost, and require considerable area to implement when implemented as one or more integrated circuits.

One way to address the need for faster routers is to fabricate an integrated circuit that is specialized to perform routing/switching tasks. Such application specific integrated circuits (ASICs) are designed to perform particular routing functions such as a matching function in conjunction with a random access memory (RAM). Unfortunately, because ASICs are custom manufactured products, they can also be expensive to manufacture.

One type of device that is particularly suitable for matching functions is a content addressable memory (CAM) (sometimes referred to as an "associative memory"). A CAM can include a number of data storage locations, each of which can be accessed by a corresponding address. The order in which the data values are stored varies according to the type of CAM. As just one example, in a typical "binary" CAM, data can be stored in the first available "empty" location. Empty locations can be distinguished from "full" (or valid) locations by a status bit associated with each storage location.

Valid locations in a binary CAM can be addressed according to the contents (data values) that they store. In a typical binary CAM matching function, a comparand value (which can be a header field or a portion thereof) can be loaded into a comparand register. The comparand value can then be compared to the data values within each valid location of the conventional binary CAM. In the event the value within the comparand register matches a value of a storage location, a match signal for the matching storage location will be generated. In the event there is more than one match, one match from the multiple matches may be selected according to predetermined priority criteria. The match indication can then be used to access other information (such as routing or packet processing information, as just two examples).

By providing for the simultaneous comparison of a comparand word value (a row of comparand bit values) with a number of data words, a rapid match function can be accomplished with a binary CAM. One drawback to conventional binary CAMs is that matching functions are typically performed on data values having a fixed number of bits. Unfortunately, many routing and switching functions can require matching a comparand value to data values having variable bit lengths. This type of matching function is often referred to as "longest prefix matching."

An example of a longest prefix matching operation will now be described. Referring now to FIG. 10, an example of five CAM entries are illustrated. The five CAM entries occupy CAM addresses 0FF0 to 0FF4. Each entry stores a binary data value having a non-masked portion that can be compared to an applied comparand value. Such non-masked portions are shown as zeros and ones in FIG. 10. In addition, each data value includes a masked portion that is not compared to an applied comparand value. The masked portions are represented by a series of Xs in FIG. 10. It is understood that each X could be a 0 or 1, but is represented by an X because the digit is "masked" according to a mask value.

Data values can be masked by providing corresponding mask data. In one particular arrangement, a mask bit can be provided for each data bit. Thus, the mask data for the first twenty bits (going from left to right) of the data value at 0FF0 can have mask bits of one value (1, for example), while the remaining twelve bits can have mask bits of another value (0, for example). A conventional ternary CAM can include memory cells that store a mask bit alongside a data bit.

FIG. 10 also illustrates a comparand value CMP. As shown in the figure, the non-masked portions of entries 0FF0 and 0FF2 match corresponding portions of the comparand value. Thus, when the comparand value is applied, entries 0FF0 and 0FF2 can generate match indications.

In a longest prefix matching operation, match indications are prioritized to select the entry having the longest non-masked portion. Thus, in the example of FIG. 10, entry 0FF0 provides the longest prefix match. Conventionally, priority between variable prefix data values can be established according to the order of entries within the CAM. Thus, data values are stored in the order of prefix length. The values with the most unmasked bits can be stored as entries at the lowest addresses. An entry having a lower address will have a higher priority.

Priority between multiple match indications is typically accomplished with a priority encoder circuit. The single match indication having the highest priority may then be applied to a memory to generate an index value. In one particular conventional approach, a prioritized match indication can be applied to a read only memory to generate an associated index value. The index value may then be used to access a random access memory which can store the rest of the associated data.

The ternary CAM approach described above can provide rapid matching operations, and so can be very useful when utilized in packet processing devices.

An important issue in CAM applications, particularly for CAMs used in packet processing devices, arises when a new data value must be added to a ternary CAM. Such operations are often referred to as "table updates." In a conventional table update, new data must be stored in a location according to its prefix length.

An example of a table update is set forth in FIGS. 11A to 11C. FIGS. 11A to 11C show the same ternary CAM at different stages in a table update operation. FIG. 11A shows the CAM prior to a table update operation. The CAM is designated by the general reference character 1100 and can include consecutive entry groups 1102-1 to 1102-5. Each consecutive group (1102-1 to 1102-5) stores data values of the same prefix length. Overall, the data values are arranged in an order within the CAM 1100, with the longest prefix being at the top of the CAM 1100 and the shortest prefix being toward the bottom. Masked portions of the data values are shown by diagonal hashing lines.

In the example of FIGS. 11A to 11C, a new data value is added that has the same prefix length as the data values of consecutive group 1102-2. Because prefix length order must be maintained, a location must be made available so that the new data value can be added as another entry to consecutive group 1102-2. This is shown in FIG. 11B.

In FIG. 11B, a location is made available by shifting data values having shorter prefixes down by one location. Consequently, the former first entry of consecutive group 1102-3 is turned into an available location to store 1104.

The new data value can then be written into the available location 1104. The CAM 1100 following such a write operation is shown in FIG. 11C. The new data value is now the last entry of consecutive group 1102-2.

A drawback to the arrangement of FIGS. 11A to 11C is that, conventionally, shifting data in the manner shown in FIG. 11B can take a large number of write operations. This can consume considerable time, and in the case of data packet processing devices, may result in processing "stalls" as the data values are reordered in the CAM.

One approach to addressing these drawbacks associated with table update operations is to include a priority field within the CAM. Such a priority field can enable data values to be stored in a CAM in no particular order. In the event there are multiple match indications, such match indications can be sorted according to their priority field. Data values with longer prefixes will have higher priority values than those with shorter prefixes.

A drawback to CAMs with priority fields is that additional memory bit locations must be provided for such priority fields. Further, search operations can take more time as priority values will have to be sorted after a comparand is matched against the data values.

It would be desirable to arrive at some way of using ternary CAMs that can perform table update operations without the drawbacks of conventional approaches.

SUMMARY OF THE INVENTION

According to one embodiment of the present invention, a ternary content addressable memory (CAM) can have a number of entries arranged into groups. CAM data values of the same data length can be stored in each group. When a new CAM data value is added to the CAM, the new data value can be stored into one of these groups according to the prefix length. Provided there are free entries in a group, a CAM data value can be added without having to reorder other data values in the CAM.

According to one aspect of the embodiments, a CAM can process a field within data packets on a data network. The field within the data packets can have various prefix lengths. Look-ups of different prefix lengths can occur with different estimated probabilities. The CAM can have a number of entries arranged into groups, each group corresponding to a prefix of a particular length. The size of a group can correspond to the general probability of the distribution of different look-ups of its associated prefix length in a network.

According to another aspect of the embodiments, a CAM can receive data values having corresponding prefix lengths. A translating circuit can receive prefix length values and provide corresponding CAM physical address values. In this way, CAM entries can be accessed according to prefix length.

According to another aspect of the embodiments, a CAM can include a storage device that stores CAM addresses corresponding to particular prefix lengths. Initially, a CAM address can be a base address for a given group of CAM entries. As a data value is added to the group, the CAM address can be incremented and stored to provide the next free address for a given group.

According to another aspect of the embodiments, a CAM can include a random access memory (RAM) having entries that store CAM address values that are accessed by corresponding prefix lengths.

According to another aspect of the embodiments, a CAM can include an encoder that receives mask values and encodes them into prefix lengths.

According to another aspect of the embodiments, a CAM can include a translator circuit that generates CAM addresses in response to an applied prefix length. A CAM address generated by a translator circuit can be incremented by a counter circuit.

According to another aspect of the embodiments, a CAM can include a translator circuit that generates CAM addresses in response to an applied prefix length. A CAM address can access a mask array or a data array according to a predetermined control signal.

According to another aspect of the embodiments, a CAM can include a number of entries arranged into fixed groups and variable groups. Fixed groups can be accessed according to a prefix length value and can store data values of the same prefix length. Variable groups can be accessed by a CAM address, and store data values having different prefix lengths.

According to another aspect of the embodiments, a CAM can include groups of entries that can store data values having predetermined prefix lengths. Prefix values can be applied to a translator circuit to generate a CAM address of the group corresponding to the prefix length. A series of data values of the prefix length can then be written into the group by a counter circuit that increments the CAM address. When the last data value of series is written into a CAM entry, the incremented CAM address can be written into the translator circuit.

BRIEF DESCRIPTION OF THE DRAWINGS

FIG. 1 is a block diagram of a first embodiment.

FIG. 2 is a block diagram of one example of a translator circuit.

FIG. 3 is a table illustrating one example of a storage circuit that may be used in a translator circuit.

FIG. 9 is a block diagram of a fourth embodiment.

FIG. 10 is a diagram of conventional ternary CAM entries and a comparand value.

FIGS. 11A–11C are diagrams illustrating a conventional table update operation in a ternary CAM.

DETAILED DESCRIPTION OF THE EMBODIMENTS

Figure 4:
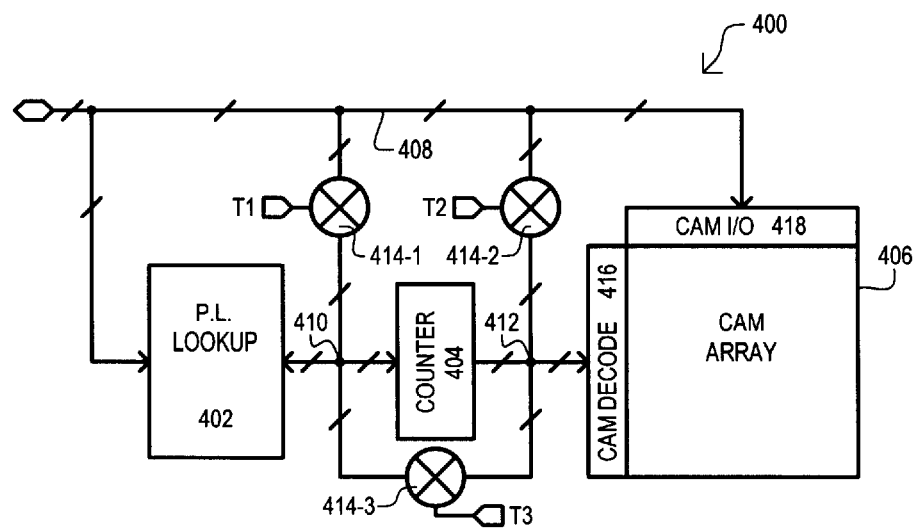
FIG. 4 is a block diagram of a second embodiment.

Various embodiments of the present invention will now be described with reference to a number of diagrams. The embodiments include a novel ternary content addressable memory (CAM) having entries that are arranged into groups. The entries of each group can store a data value having a predetermined prefix length. Data values may be updated according to prefix length without having to reorder the entries in the CAM.

Referring now to FIG. 1 a first embodiment is set forth in a block diagram. The embodiment is a novel ternary CAM, and is designated by the general reference character 100. The CAM 100 can include a CAM array 102 having a plurality of CAM entries that can store data values and corresponding mask values. A mask value can determine the prefix length of a data value. In one approach, mask values within each group can be fixed, and therefore preset when the device is initialized. This can save software central processing unit (CPU) cycles on each update.

In one particular arrangement, a CAM array 102 can include a number of ternary CAM cells arranged into rows. Each ternary CAM cell can store a binary data value and corresponding binary mask value. A data value and corresponding mask value can be stored in a row of CAM cells.

A CAM array 102 can be conceptualized as including a data array, which represents the various data values of the CAM array, and a mask array, which represents the various mask values of the CAM array.

A CAM 100 can further include a prefix length translator 104. A prefix length translator 104 can receive a prefix length value (P.L.) and translate this value into a CAM array 102 address. A prefix length translator 104 can include various circuit elements and types. As but a few examples, a prefix length translator 104 can include a random access memory (RAM), a CAM, or register blocks. A RAM may include entries that are accessed according to a prefix length value. Each RAM entry can store a corresponding address for CAM array 102. RAM entries can be incremented each time a data value having a particular prefix length is written into the CAM array 102.

If a prefix translator 104 includes a CAM, such a CAM can include entries that store particular prefix value lengths. Each such CAM entry can generate associated data. The associated data can be an address for CAM array 102. Of course, a prefix length translator 104 could take a variety of other forms, including a set of storage circuits for storing CAM array addresses, and logic for reading particular registers in response to an applied prefix length.

In one particular arrangement, a CAM 100 may further include a prefix length encoder 106. A prefix length encoder 106 can receive a mask value, and encode the mask value into a prefix length value. As just one of the many possible examples, a mask value may include a series of consecutive "1" values, indicating a prefix length, and a series of consecutive zero values, indicating the length of a masked portion of a data value. A prefix length encoder 106 could encode the sequential 1 values into a binary number. The binary number can be a prefix length value.

By assigning predetermined CAM array 102 addresses to particular prefix length values, various entries in the CAM array 102 can essentially be assigned to store data values of a predetermined prefix length. Such an arrangement can result in a CAM array 102 that includes entry groups. The particular example of FIG. 1 shows five groups 108-1 to 108-5.

The various groups 108-1 can store data values having a predetermined prefix length. In the particular example of FIG. 1, group 108-1 can store data values having a prefix length "V," group 108-2 can store data values having a prefix length "W," group 108-3 can store data values having a prefix length "X," group 108-4 can store data values having a prefix length "Y," and group 108-5 can store data values having a prefix length "Z." Each group can include data values having a non-masked portion (the size of its prefix) and a masked portion. The masked portion of data values in each group are represented in FIG. 1 by diagonal "hashing" lines.

The various groups (108-1 to 108-5) can be arranged in a particular order within the CAM array 102 to allow for longest prefix matching. In the particular example of FIG. 1, groups can be arranged from longest prefix length to shortest prefix length. Thus, prefix length V>W>X>Y>Z. Such an arrangement can allow a priority encoder, that prioritizes according to CAM array entry position, to select a longest prefix match.

In FIG. 1, each group (108-1 to 108-5) is only partially full. That is, empty entries remain in each group. Thus, each group (108-1 to 108-5) can include a base address as well as a "current address." A base address may indicate where a group can start. For example, a base address may be the address corresponding to the first entry of a group or the address just prior to the first entry of a group. A current address can indicate where a group may end. For example, a current address may indicate the last entry in a group that stores data, or the next free entry of a group. In FIG. 1, the base address and current address of group 108-1 are shown as GRP1_ADD_BASE and GRP1_ADD_CURR, respectively.

As shown in the example of FIG. 1, base addresses may be established for groups of particular sizes. Certain groups may be selected to be larger than other groups depending on the distribution of prefixes in a network, as but one example. The particular size of a group, and/or the differences in size between the groups can be established according to network processing criteria. As just one example, data values can correspond to particular "look-ups" when processing a network packet. If the expected or estimated probability of different look-ups of size V is greater than that of size W, the number of entries in group 108-1 can be greater than that of group 108-2.

Referring now to FIG. 2, one example of prefix length translator is set forth in a block diagram and designated by the general reference character 200. The prefix length translator 200 can include a prefix length look-up circuit 202 and a counter circuit 204. A prefix look-up circuit 202 can include various circuits described above in conjunction with item 104 (e.g., RAM, CAM, registers and logic, etc.). Consequently, a prefix look-up circuit 202 can provide a CAM array address, shown as CAM_ADD for corresponding prefix length values.

A CAM_ADD value can be applied to the counter circuit 204. The counter circuit 204 can increment the CAM_ADD value according to count control signals CNT_CTRL. The output of the counter circuit 204 can be an incremented CAM array address CAM_ADD+1. In this way, a prefix length translator 200, according to one embodiment, can generate CAM array address values according to a prefix length value, and then increment such values according to control signals. Such an arrangement can allow a number of different data values, having the same prefix length, to be written into consecutive locations of the same CAM array.

FIG. 3 sets forth an example of a storage circuit 300 that may be used in a look-up circuit, such as 202. The storage circuit 300 can have the general configuration of a RAM, including data values (shown as a DATA column) that are accessed by address values (shown as the ADD column). However, alternate storage approaches could be used, such a register block, as but one example. The particular values of FIG. 3 can correspond to the arrangement of FIG. 1. Thus, if a prefix length of size V is applied to the storage circuit 300, the CAM address GRP1_ADD_CURR can be output.

FIG. 4 sets forth a block diagram of a third embodiment of the present invention. The third embodiment is designated by the general reference character 400, and is shown to include a prefix length lookup circuit 402, a counter circuit 404 and a CAM array 406. The third embodiment 400 may also include a main bus 408, a prefix output bus 410, and a CAM input bus 412.

The third embodiment 400 further includes a first transfer circuit 414-1, a second transfer circuit 414-2, and a third transfer circuit 414-3. A first transfer circuit 414-1 can connect main bus 408 to prefix output bus 410. A second transfer circuit 414-2 can connect main bus 408 to CAM input bus 412. A third transfer circuit 414-3 can connect a CAM input bus 412 to a prefix output bus 410. Transfer circuits 414-1 to 414-3 can be activated by transfer signals T1 to T3, respectively. When activated, transfer circuits (414-1 to 414-3) can connect their respective buses together. When inactive, transfer circuits (414-1 to 414-3) can isolate their respective buses from one another.

A CAM array 406 can include a decode section 416 that can access CAM entries according to an applied input address, and an input/output (I/O) section 418 that can enable write data to be written into an addressed CAM entry, or enable read data to be read from an addressed CAM entry.

A CAM according to the third embodiment 400 may perform conventional CAM write operations. In addition, a third embodiment 400 may perform novel prefix write operations.

Figure 5A:
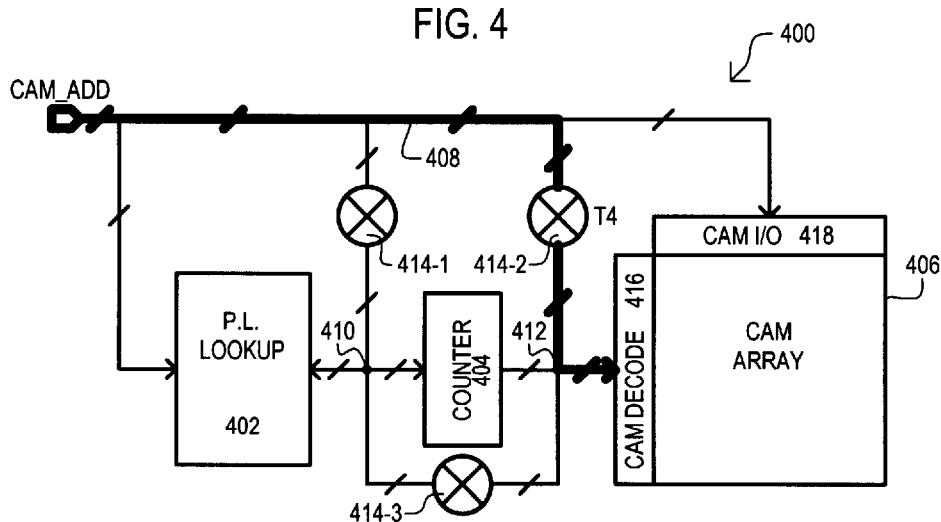
FIGS. 5A and 5B illustrate a conventional CAM write operation according to the second embodiment.
Figure 5B:
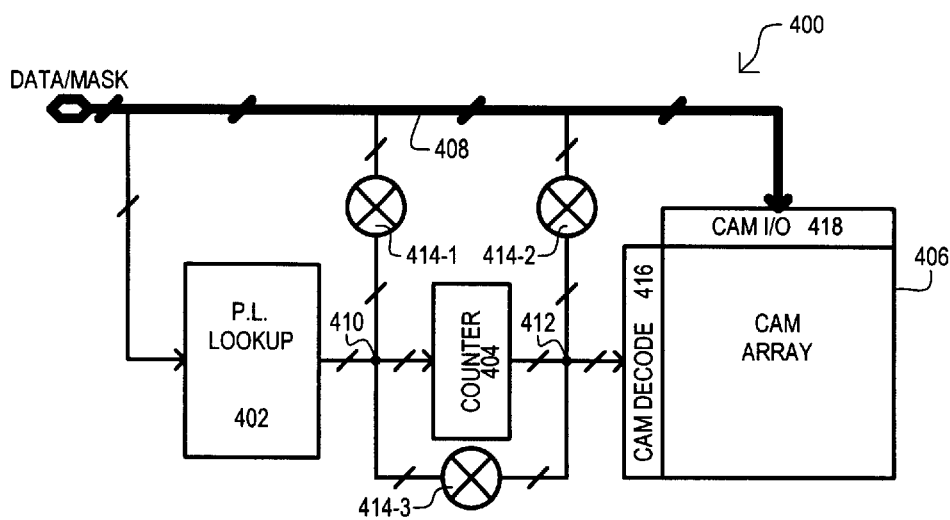

FIGS. 5A and 5B illustrate a conventional CAM write operation according to the third embodiment 400. In FIG. 5A a CAM array address (CAM_ADD) can be driven on main bus 408. Transfer circuits 414-1 and 414-3 can be inactive, while transfer circuit 414-2 is active. The CAM_ADD value can be placed on CAM input bus 412 and applied to the CAM decode section 416. The CAM decode section 416 can select a predetermined location in the CAM array 400. In one particular arrangement, an entry in a data array or an entry in mask array can be selected.

As shown in FIG. 5B, once a CAM array has been selected by the application of a CAM address, a CAM array data value (DATA/MASK) may be written. Transfer circuits 414-1 and 414-3 can remain inactive, while transfer circuit 414-2 is also inactive. The DATA/MASK value can be placed on CAM main bus 408 and applied to the CAM I/O section 418. The DATA/MASK value can be a data value if the previously selected CAM entry is within a data array or a mask value if the previously selected CAM entry is within a mask array.

Figure 6A:
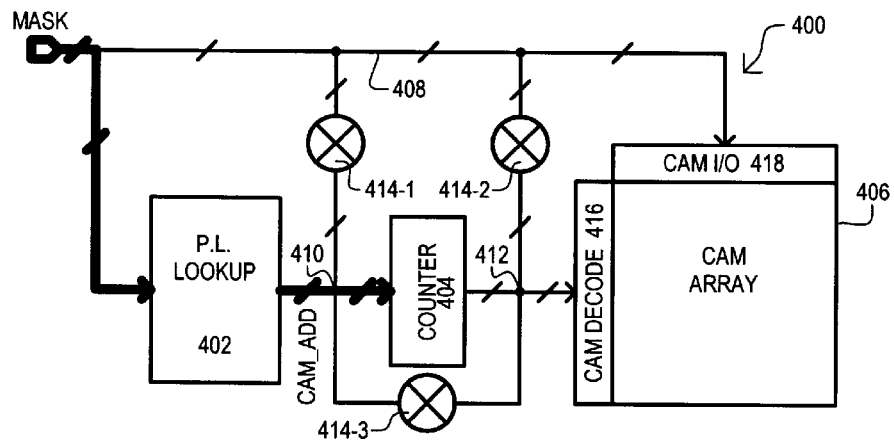
FIGS. 6A to 6C illustrate a CAM prefix write operation according to the second embodiment.
Figure 6B:
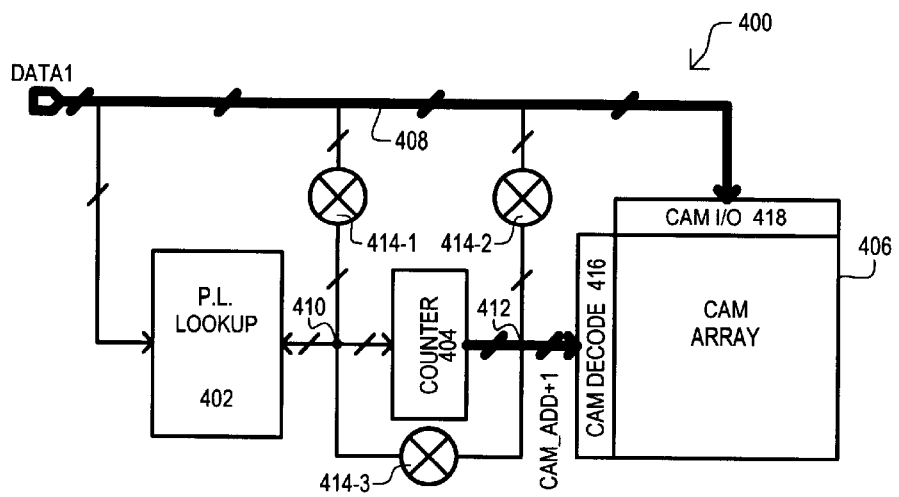
Figure 6C:
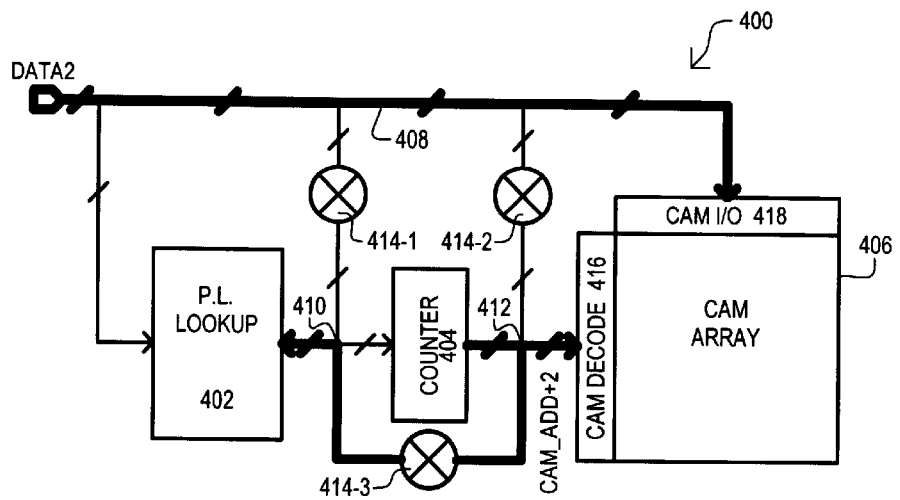

FIGS. 6A to 6C illustrate a "prefix" CAM write operation according to the third embodiment 400. The particular arrangement of FIGS. 6A to 6C show a prefix write operation in which two data values having the same prefix length are sequentially written into the CAM array 406.

In FIG. 6A a prefix value can be applied to the CAM 400. In the particular arrangement of FIG. 6A, the prefix value can be derived from a mask value. Thus, a mask value (MASK) can be driven on main bus 408. Transfer circuits 414-1 to 414-3 can be inactive. The MASK value can be applied to the prefix length look-up circuit 402 which can generate a CAM address (CAM_ADD) on prefix output bus 410. In one particular arrangement, the CAM_ADD value can be latched in counter circuit 404.

As shown in FIG. 6B, a counter circuit 404 can increment a CAM_ADD value to generate a first incremented CAM address value CAM_ADD+1. The value CAM_ADD+1 may then be applied to the CAM decode section 416. The CAM decode section 416 may then select a predetermined entry in the CAM array 400. The entry may be one entry of a group having the same prefix length as the previously applied MASK value.

As also shown in FIG. 6B, once a CAM array entry has been selected by CAM_ADD+1, a CAM data value (DATA1) may be written. Transfer circuits 414-1 to 414-3 can remain inactive, and the DATA1 value can be placed on CAM main bus 408 and applied to the CAM I/O section 418.

In FIG. 6C, a counter circuit 404 can increment a CAM_ADD+1 value to generate a second incremented CAM address value CAM_ADD+2. The value CAM_ADD+2 may then be applied to the CAM decode section 416. The CAM decode section 416 may then select a predetermined entry in the CAM array 400. The entry can be in the same group accessed by the CAM_ADD+1 value. Further, once a CAM array entry has been selected by CAM_ADD+2, a second CAM data value (DATA2) may be written. Transfer circuits 414-1 and 414-2 can remain inactive, and the DATA2 value can be placed on CAM main bus 408 and applied to the CAM I/O section 418.

As also shown in FIG. 6C, transfer circuit 414-3 can be activated. Consequently, the CAM_ADD+2 value can be placed on the prefix output bus 410. In the particular arrangement of FIG. 4, the prefix output bus 410 may be an input/output bus. Thus, when the CAM_ADD+2 value is on the prefix output bus 410, it can be stored in the prefix length lookup circuit 402. In this way, as values are added to a particular group within CAM array 400, the address associated with the group can be incremented and stored, allowing a next free address for the group to be generated when the next data value is written to the group.

Figure 7:
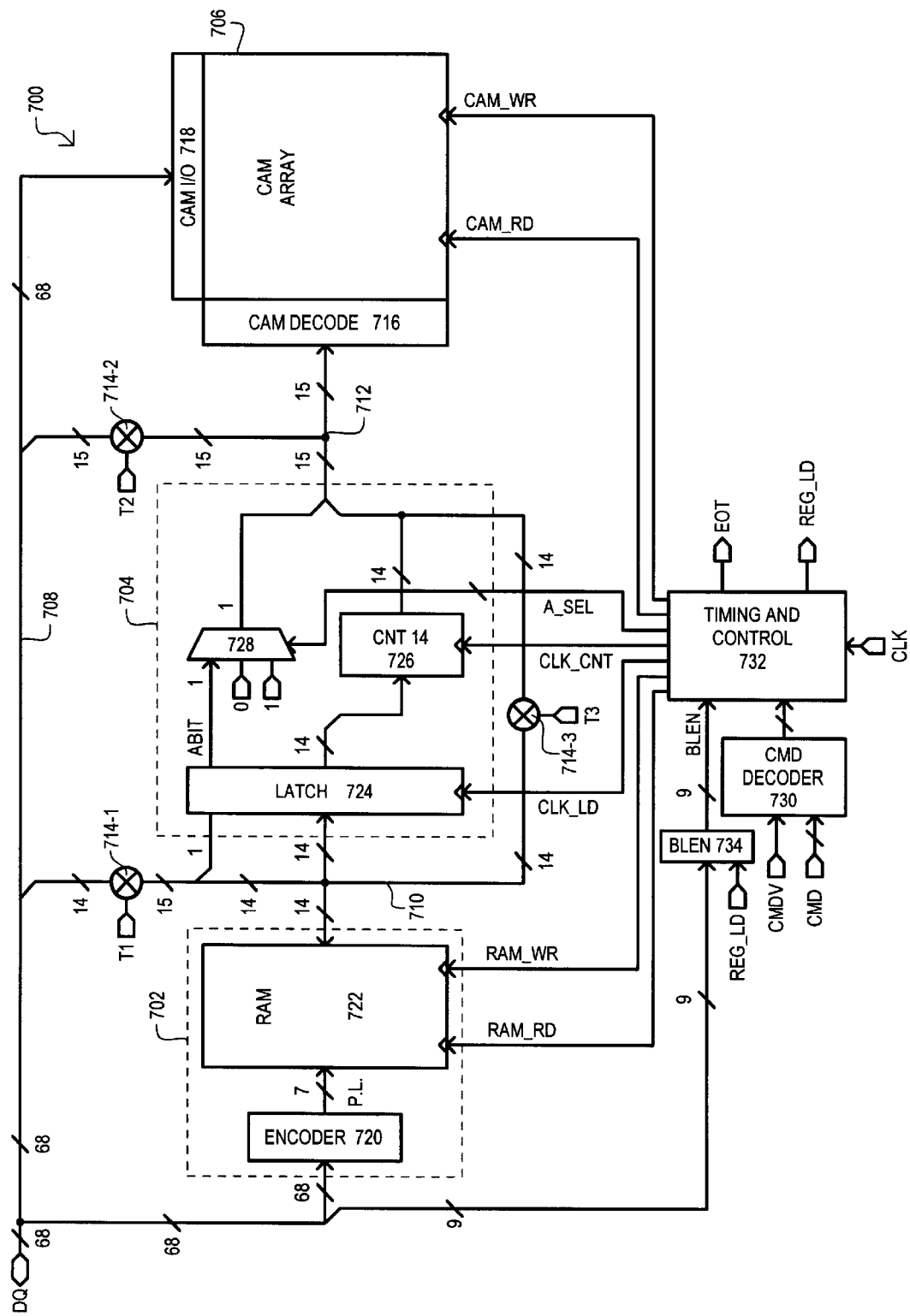
FIG. 7 is a schematic diagram of a third embodiment.

Referring now to FIG. 7, a more particular fourth embodiment is set forth in a schematic diagram. The fourth embodiment 700 is shown to include some of the same general portions as the third embodiment 400. To that extent, like portions will be referred to by the same reference character but with the first number being a "7" instead of an "4."

In the fourth embodiment 700, a prefix length lookup circuit 702 can include an encoder 720 and a RAM 722. An encoder 720 can encode mask bit values into a prefix length value (P.L.). In the example of FIG. 7, 68 mask bits can be encoded into a 7-bit P.L. value.

A P.L. value can serve as an address for RAM 722. RAM 722 can include predetermined RAM data values corresponding to particular address values. The RAM data values can be CAM array address values. In the example of FIG. 7, CAM array 706 can include a 16K (16,384) by 68 CAM cell array. Consequently, a 7-bit P.L. value can access 14-bit CAM address values.

A RAM 722 may receive a RAM read command (RAM_RD) and a RAM write command (RAM_WR). When RAM_RD is active (high for example), RAM 722 can output a stored value on prefix output bus 710 according to an applied P.L. value. Conversely, when a RAM_WR is active (high for example), RAM 722 can store a value on prefix output bus 710 according to an applied P.L. value.

In the fourth embodiment 700, a counter circuit 704 can include an input latch 724, a counter circuit 726, and a mode multiplexer 728. An input latch 724 can be controlled by a load clock signal CLK_LD. When CLK_LD is active (pulses high for example), data on the prefix output bus 710 can be latched within latch 724. Such a data value can be the CAM array address corresponding to a particular prefix length. In the particular arrangement of FIG. 7, latch 724 can latch 14 bits from prefix output bus 710, and in addition, can latch an array select bit ABIT from main bus 708. The ABIT will be described in more detail below.

A counter circuit 726 can increment data values latched in latch 724 according to a count clock signal CLK_CNT. When CLK_CNT is active (pulses high for example), a CAM array address provided by latch 724 can be incremented. In the particular arrangement of FIG. 7, counter circuit 726 is a 14-bit counter.

A multiplexer 728 can receive a number of input signals, and according to an array select signals A_SEL, provide one input as an output. In the particular arrangement of FIG. 7, multiplexer 728 can receive an array select bit ABIT from latch 724 as one input, the logic value 1 as a second input, and the logic value 0 as a third input.

A multiplexer 728 can allow access to either a mask array or a data array within CAM array 706. In particular, CAM array 706 can be conceptualized as including a 16K×68 mask array and a 16K×68 data array. One of 16K rows can be selected by 14-bits of an address. A fifteenth address bit can determine if the mask array or data array is accessed. In one particular arrangement, a fifteenth bit can determine if a mask word line or data word line for given row is activated.

In a conventional block CAM write operation, a 15-bit base CAM address can be applied to decoder 716 and latched within latch 724. A value can then be placed on main bus 708 and written into the CAM. On subsequent clock cycles, counter circuit 726 can increment 14 bits of the address allowing the values of the block to be placed in sequential entries in the CAM. A_SEL signals can result in multiplexer 728 providing the ABIT signal as an output. This can ensure that the block of values is written into the selected array (mask or data).

As will be described in more detail below, in a prefix data write operation, A_SEL signals can result in multiplexer 728 providing a logic value corresponding to a data array. In a prefix mask write operation, A_SEL signals can result in multiplexer 728 providing a logic value corresponding to a mask array.

In the fourth embodiment 700, a prefix output bus 710 and CAM input bus 712 can include fewer bus lines than a main bus 708. In one particular example, a main bus 708 can include 68 bits, a prefix output bus 710 can include 14 bits, and a CAM input bus 712 can include 15 bits. Such an arrangement can arise out of a main bus that is shared. That is, a main bus that can receive address values as well as data values.

A CAM array 706 can receive a CAM read control signal (CAM_RD) and a CAM write control signal (CAM_WR). When CAM_WR is active, data on main bus 708 can be written into CAM array 706 according to address data on CAM input bus 712. When CAM_RD is active, data can be read onto main bus 708 from CAM array 706 according to address data on CAM input bus 712.

A transfer circuit 714-1 can be activated by a transfer signal T1. When transfer signal T1 is active (high for example), 14 bits from main bus 708 can be coupled to prefix output bus 710. Further, the ABIT can be coupled to counter circuit 704.

A transfer circuit 714-2 can be activated by a transfer signal T2. When transfer signal T2 is active (high for example), 15 bits from main bus 708 can be coupled to CAM input bus 712.

A transfer circuit 714-3 can be activated by a transfer signal T3. When transfer signal T3 is active (high for example), 14 bits from CAM input bus 712 can be coupled to prefix output bus 710.

A fourth embodiment 700 may further include a command decoder circuit 730 and a timing and control circuit 732. A command decoder 730 can receive a command active signal CMDV and a command value CMD. When CMDV is active (high for example), a command value CMD can be decoded into a number of control signals. A timing and control circuit 732 can receive decoded control signals from command decoder 730 as well as a timing signal (CLK) and a burst length value BLEN.

In response to various input signals, timing and control circuit 732 can provide various internal timing and control signals, including the previously described signals, RAM_RD, RAM_WR, CLK_LD, CLK_CNT, A_SEL, T1, T2, T3, CAM_RD and CAM_WR.

A timing and control circuit 732 can further provide an end of transfer signal EOT and register load signal REG_LD. An EOT signal can be driven to a predetermined value when a transfer is taking place (low for example), and then transition to a different value when a transfer is complete (high for example). A REG_LD signal can load a burst length register 734 with a burst length value BLEN. A BLEN can determine how many times a CLK_CNT signal is active (pulses high, for example) in a block write operation. The BLEN value can be supplied to the timing and control circuit 732.

In addition to providing a conventional block CAM write operation, the fourth embodiment 700 may further provide a number of other novel write operations.

Figure 8A:
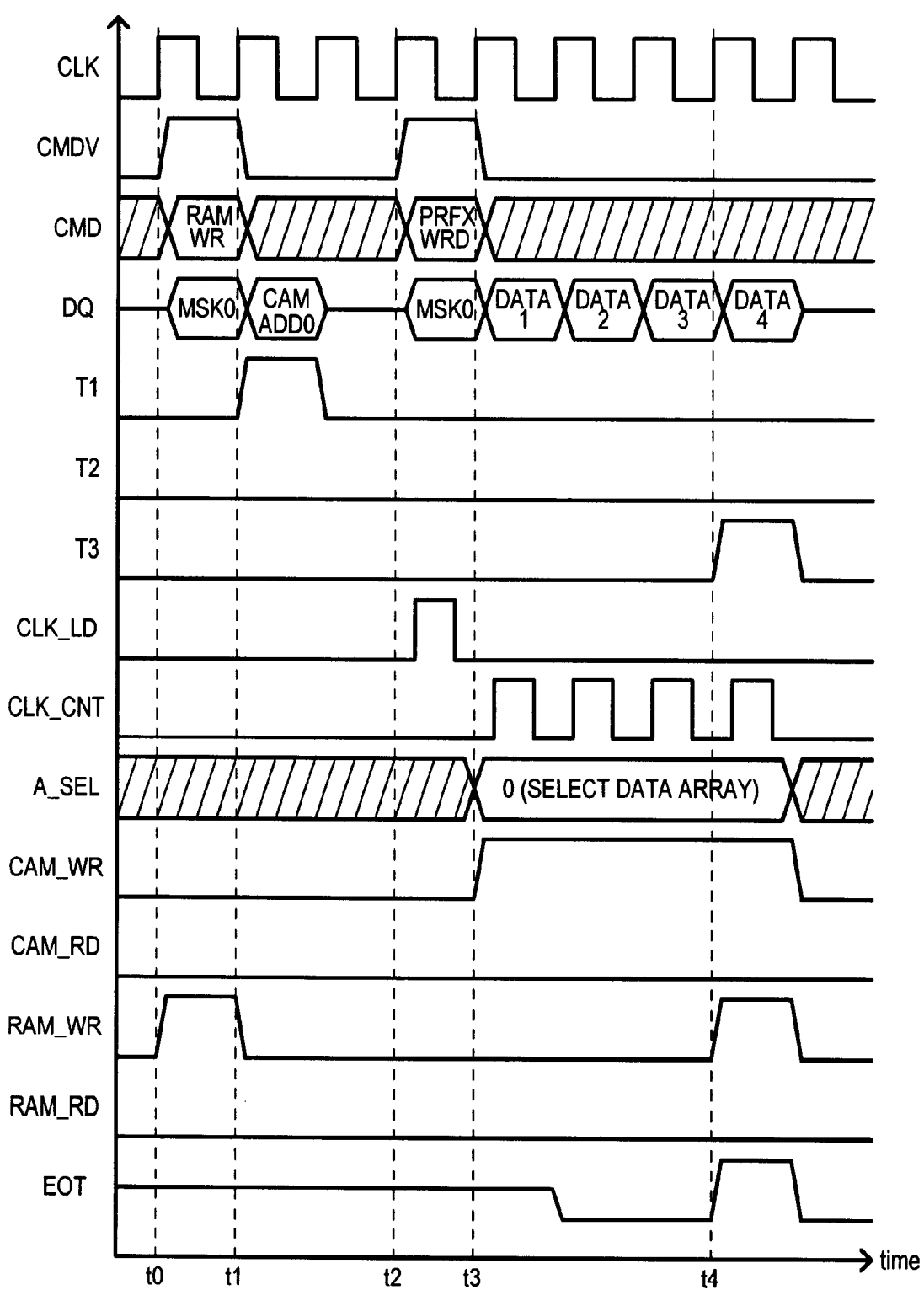
FIGS. 8A and 8B are timing diagrams illustrating various operations according to the third embodiment.
Figure 8B:
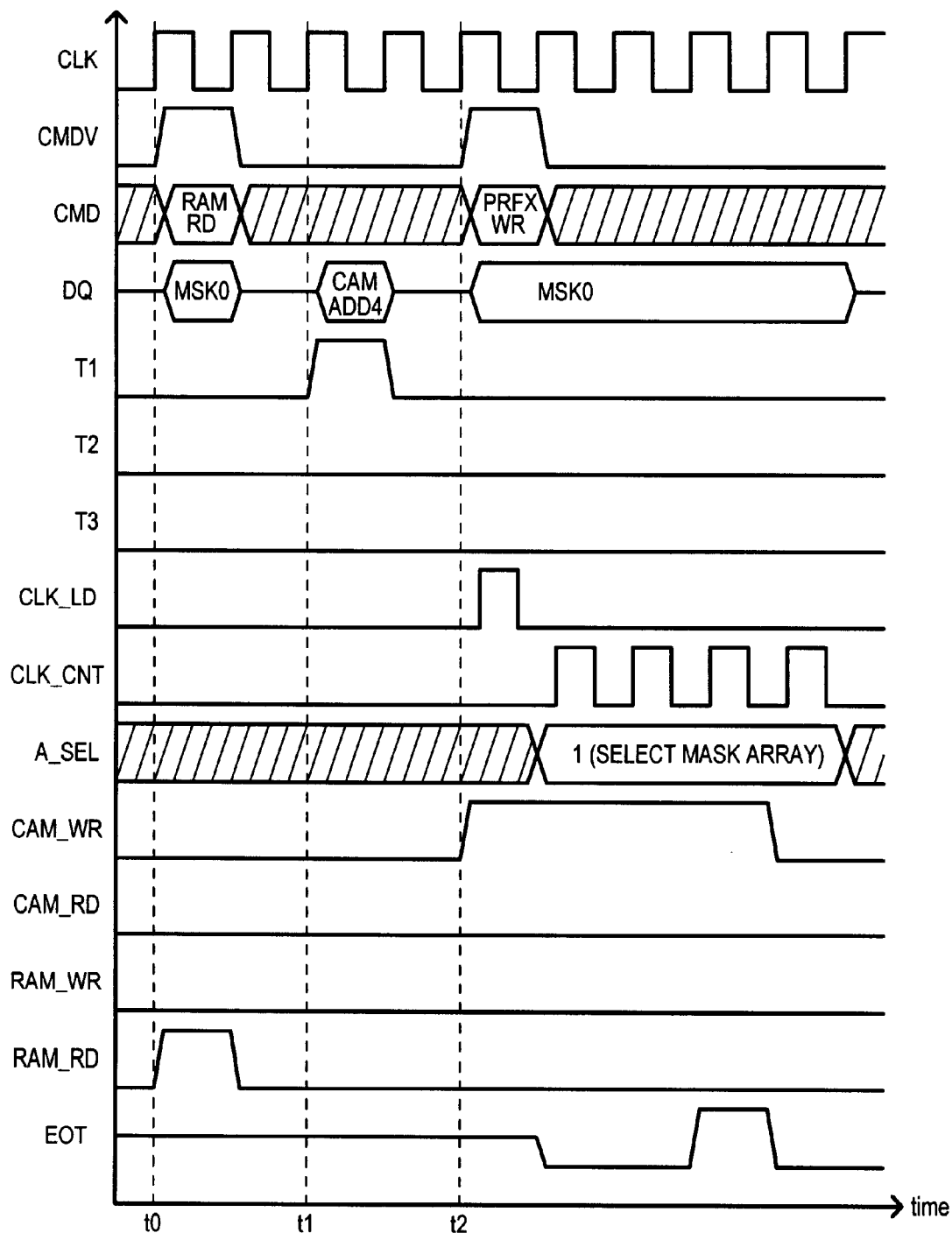

Referring now to FIGS. 8A and 8B, two timing diagrams are set forth illustrating various operations of the fourth embodiment.

FIG. 8A shows a RAM write operation (RAM WR) and prefix data write operation (PRFX WRD) that writes data values into a CAM data array. A RAM WR operation can write data values into RAM 722 according to prefix lengths. A RAM WR operation can be used to write base address values for groups within the CAM array 706. A PRFX WRD operation can write a block of data values into sequential locations in the data array according to the prefix length of the data values.

FIG. 8B shows a RAM read operation (RAM RD) and prefix mask write operation (PRFX WRM) that writes mask values into a mask array. A RAM RD operation can read data from a RAM 722 according to prefix lengths. A PRFX WRM operation can write a block of mask values into sequential locations in the mask array according to the prefix length of the mask values. Such an operation could be used to "fill" a group of entries in the mask array with the same mask value.

Referring now to FIG. 8A, the operations will be described in detail. A RAM WR operation begins at time t0. At time t0, the CMDV signal transitions high indicating the entry of a command. With CMDV high, a RAM WR command can be applied to the command decoder 730. At the same general time a mask value (MSK0), having a particular prefix length can be placed on main bus 708 (shown as DQ). The MSK0 value can be translated into a RAM address that selects a particular RAM entry.

At time t1, the RAM WR command can result in the RAM_WR and T1 signals transitioning high. At the same general time, a CAM address value (CAM ADD0) can be placed on main bus 708. Consequently, the CAM ADD0 value on main bus 708 can be written into RAM 722 through transfer circuit 714-1.

Referring back to FIG. 8A, at time t2, a prefix write command PRFX WRD can be applied while the CMDV signal is high. At the same general time, a mask value (MSK0) of a particular prefix length can be placed on main bus 708. The MSK0 value can be translated into a RAM address that selects a particular RAM entry. Because the value CAM ADD0 has been previously loaded for this prefix value, the CAM ADD0 value will be applied to latch 724. A PRFX WRD command can result in the CLK_LD signal transitioning high after time t2. This can latch the CAM ADD0 value within latch 724.

In addition, a PRFX WRD command can result in the CLK_CNT signal transitioning high in a consecutive number of clock cycles equal to the burst length value BLEN. Further, a PRFX WRD command can result in the A_SEL values selecting the "0" value for multiplexer 726, and the CAM_WR signal being driven high during the burst operation. It is understood that with each pulse of the CLK_CNT signal, the address value MSK0 can be incremented.

Data values can be driven on following clock cycles of the burst write operation. Thus, the DQ waveform is shown to be driven with DATA1, DATA2, DATA3 and DATA4 values and subsequent cycles.

As shown at time t4, on the last cycle of a burst, the T3 signal can transition high along with the RAM_WR signal. This can allow the last incremented address value to be written back into the RAM 722. Thus, at time t4, an address value MSK0+4 can be written back into the RAM 722.

Referring now to FIG. 8B, two more operations will be described. A RAM read operation (RAM RD) can be similar to a RAM WR operation. However, the RAM RD operation can result in the RAM_RD signal being driven high. Further, in particular example of FIG. 8B, latency in the RAM 722 can result in the read data being available at time t1. A RAM RD command can also result in signal T1 transitioning high at time t1. This activates transfer circuit 714-1, allowing the read data (CAM ADD4) to be placed on main bus 708.

Also shown in FIG. FIG. 8B is a PRFX WRM command that is applied at time t2. At the time the PRFX WRM command is applied, mask value (MSK0) of a particular prefix length can be placed on main bus 708. The MSK0 value can be translated into a RAM address that selects a particular RAM entry. The RAM entry can provide a corresponding CAM address value. In the particular arrangement of FIG. 8B, because the MSK0 value is applied, the RAM 722 will output the CAM ADD4 value.

In response to the PRFX WRM command, the CLK_LD signal can pulse high, latching a CAM address from RAM 722 within latch 724. The PRFX WRM operation can continue in a similar fashion to the PRFX WRD operation. However, the same mask value MSK0 can be maintained on the main bus 708 throughout the burst write. In addition, the PRFX WRM can result in the A_SEL values selecting the "1" value for multiplexer 728. As a result, as the CLK_CNT signal pulses high, the MSK0 value will be written into consecutive locations within the mask array of CAM array 706. The PRFX WRM operation also differs in that the RAM_WR signal is not activated at the end of the write operation. In this way, the same mask value can be written into consecutive locations within a mask array.

It is understood that while FIG. 1 sets forth a CAM array arrangement having groups of entries that store, or will store, data values of uniform prefix length, this should not be construed as limiting to the invention. It may be desirable to store certain prefix lengths in some groups, while the remaining groups can store variable prefix lengths. Such an arrangement can result in fast table updating for those prefix lengths having a corresponding group.

Referring now to FIG. 9, one example of a CAM grouping arrangement is set forth in FIG. 9. The CAM is designated by the general reference character 900 and is shown to have a CAM array 902 with entries arranged into "fixed" groups 904-a to 904-c and "variable" groups 906-a and 906-b. Fixed group 904-a can store data values having a prefix length of X, fixed group 904-b can store data values having a prefix length of Y, and fixed group 904-c can store data values having a prefix length of Z. Variable group 904-a can store, in a longest-to-shortest order, data values having prefix lengths greater than Y but less than X. In a similar fashion, variable group 904-b can store, in a longest-to-shortest order, data values having prefix lengths greater than Z but less than Y.

In the embodiment of FIG. 9, data values having prefix lengths of X, Y or Z can be written to the CAM without having to reorder entries. However, data values having prefix lengths that do not correspond to a fixed group can be reordered within their particular variable group according to conventional table update techniques.

While the various embodiment have described systems that generate prefix length values that represent the size of "non-masked" portions of a data value, the present invention can lookup "prefix" length values that represent masked portions of a data value. Further, a "prefix length value," as defined herein, can also include a "masked" prefix value. A masked prefix value can represent non-contiguous portions of a data value that are non-masked (or masked). As just one example, an encoder can encode particular masked prefix schemes into a RAM address value. A RAM can store a CAM address for storing a data value with a masked prefix with a predetermined priority.

Accordingly, it is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A content addressable memory (CAM) that can store data values and corresponding mask values, the CAM comprising:
   a data bus;
   a CAM cell array having a plurality of entries coupled to the data bus by the application of a particular CAM array address to the CAM cell array; and
   a prefix length translator circuit that generates a predetermined CAM array address in response to a prefix length value.

2. The CAM of claim 1, wherein:

the CAM cell array entries are dividable into a plurality of entry groups, each entry group corresponding to a particular prefix length value and storing data values of the prefix length, the entry groups being arranged in order of prefix length size in the CAM cell array.

3. The CAM of claim 2, wherein:

each entry group includes a base address and a current address, the current address of each entry group being stored in the prefix length translator.

4. The CAM of claim 1, wherein:

the prefix length translator includes a storage circuit that stores CAM array addresses, the CAM array addresses being accessed by the application of corresponding prefix length values.

5. The CAM of claim 4, wherein:

the prefix length translator includes a random access memory.

6. The CAM of claim 1, wherein:

the prefix length translator includes a counter circuit that increments CAM array addresses in response to clock control signals.

7. The CAM of claim 6, wherein:

the prefix length translator includes a storage circuit that stores CAM array addresses that are incremented by the counter circuit.

8. The CAM of claim 1, wherein:

data values stored in entries can have corresponding mask values with non-masked portions and masked portions; and a prefix length translator circuit includes an encoder circuit that encodes non-masked portions into a prefix length value.

9. A content addressable memory (CAM), comprising:

a prefix look-up circuit that provides CAM address information in response to prefix length values; and a CAM array coupled to the prefix look-up circuit, the CAM array including a decoder circuit that accesses selected CAM array entries in response to CAM address information from the prefix look-up circuit on a CAM input bus.

10. The CAM of claim 9, further including:

a main bus coupled to the CAM input bus by a first transfer circuit.

11. The CAM of claim 9, further including:

a counter circuit coupled to the prefix look-up circuit and CAM array, the counter circuit incrementing CAM address information provided by the prefix look-up circuit.

12. The CAM of claim 11, further including:

the counter circuit is coupled to the prefix look-up circuit by a prefix output bus; and a main bus coupled to the prefix output bus by a second transfer circuit.

13. The CAM of claim 11, further including:

the counter circuit receives CAM address information on a prefix output bus and provides incremented CAM address information on the CAM input bus; and the CAM input bus is coupled to the prefix output bus by a third transfer circuit.

14. The CAM of claim 13, wherein:

the prefix look-up circuit provides output address information on the prefix output bus and can receive incremented input address information on the prefix output bus.

15. A system, comprising:

a storage device that provides stored CAM address values in response to prefix values and an active store read signal, and stores CAM address values in response to a prefix value and an active store write signal; and a ternary content addressable memory (CAM) coupled to the storage device and having a plurality of entries, the entries being arranged into entry groups associated with a particular prefix value, the CAM storing data in an entry in response to a CAM address value and a CAM write value.

16. The system of claim 15, wherein:

the storage device includes a random access memory (RAM) having a plurality of RAM entries, each RAM entry being addressable by a particular prefix value and storing a CAM address value of the entry group corresponding to the prefix value, the RAM providing stored CAM address values as read data, and storing CAM address values as write data.

17. The system of claim 16, wherein:

the storage device includes an encoder that encodes mask values into a prefix value.

18. The system of claim 16, wherein:

the RAM includes a prefix output bus that provides read data and receives write data.

19. The system of claim 15, further including:

a count circuit coupled to the storage device and the ternary CAM, the counter circuit incrementing CAM address values from the storage device and providing incremented CAM address values to the ternary CAM.

20. The system of claim 19, wherein:

the ternary CAM includes a data array and a mask array, the data array being selected by a first address value and the mask array being selectable by a second address value; and the count circuit includes an array selector that provides the first or second address value to the ternary CAM in conjunction with a CAM address value generated from a prefix value.

* * * * *